United States Patent
Oka

(10) Patent No.: US 6,948,239 B2
(45) Date of Patent: Sep. 27, 2005

(54) METHOD FOR FABRICATING SEMICONDUCTOR APPARATUS USING BOARD FRAME

(75) Inventor: Takahiro Oka, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 299 days.

(21) Appl. No.: 10/317,152

(22) Filed: Dec. 12, 2002

(65) Prior Publication Data

US 2003/0082855 A1 May 1, 2003

Related U.S. Application Data

(62) Division of application No. 09/324,773, filed on Jun. 3, 1999, now Pat. No. 6,512,287.

(30) Foreign Application Priority Data

Jun. 4, 1998 (JP) ......................................... H10-156476

(51) Int. Cl.[7] .......................... H01R 43/00; H05K 13/00
(52) U.S. Cl. ............................. 29/855; 29/827; 29/856; 29/854; 257/666; 257/678; 257/692; 257/668; 257/787
(58) Field of Search .......................... 29/827, 856, 855, 29/854; 257/666, 676, 678, 692, 693, 668, 734, 737, 738, 783, 784, 786, 787

(56) References Cited

U.S. PATENT DOCUMENTS

| | | | | |
|---|---|---|---|---|
| 4,769,344 A | * | 9/1988 | Sakai et al. ..................... | 29/827 |
| 4,816,427 A | * | 3/1989 | Dennis ......................... | 29/827 |
| 5,422,163 A | * | 6/1995 | Kamiyama et al. .......... | 428/156 |
| 5,691,242 A | * | 11/1997 | Nomi et al. ................. | 437/206 |
| 5,731,231 A | * | 3/1998 | Miyajima .................... | 438/124 |
| 5,753,969 A | * | 5/1998 | Suzuya et al. .............. | 257/667 |
| 5,753,974 A | * | 5/1998 | Masukawa ................... | 257/737 |
| 5,914,531 A | * | 6/1999 | Tsunoda et al. ............. | 257/668 |
| 5,986,335 A | * | 11/1999 | Amagai ....................... | 257/668 |
| 6,100,598 A | * | 8/2000 | Kaneska ...................... | 257/787 |
| 6,111,306 A | * | 8/2000 | Kawahara et al. .......... | 257/666 |
| 6,369,440 B1 | * | 4/2002 | Kobayashi ................... | 257/672 |
| 2002/0084518 A1 | * | 7/2002 | Hasebe et al. .............. | 257/676 |

FOREIGN PATENT DOCUMENTS

| JP | 09-252065 | | 9/1997 |
|---|---|---|---|
| JP | 11-87386 | * | 3/1999 |
| JP | 11-260951 | * | 9/1999 |

* cited by examiner

*Primary Examiner*—Rick Kiltae Chang
(74) *Attorney, Agent, or Firm*—Rabin & Berdo, P.C.

(57) ABSTRACT

A method for fabricating a semiconductor apparatus using a board frame. A wiring board region of the frame includes an island on which a semiconductor device is mounted. A marginal region of the frame surrounds the wiring board region. A frame region is located around the marginal region. A support region extends between the wiring board region and the frame region to connect the wiring board region and frame region together through the support region. The marginal region is removed from the board frame and then put back to its original position, while maintaining the wiring board region connected to the frame region through the support region. Then, the device is mounted onto the island. Next, transfer-molding is performed on the device using a die set that includes a gate through which a thermosetting resin is guided into a cavity. Then, the marginal region is removed completely from the board frame.

17 Claims, 13 Drawing Sheets

US 6,948,239 B2

METHOD FOR FABRICATING SEMICONDUCTOR APPARATUS USING BOARD FRAME

CROSS REFERENCE TO RELATED APPLICATION

This is a Divisional of U.S. application Ser. No. 09/324,773 filed Jun. 3, 1999 now U.S. Pat. No. 6,512,287.

This application claims the priority of Application No. H10-156476, filed Jun. 4, 1998 in Japan, the subject matter of which is incorporated herein by reference.

TECHNICAL FIELD OF THE INVENTION

The present invention relates to a board frame used for fabricating a semiconductor apparatus, using a transfer molding technique. The present invention also relates to a method for fabricating such a board frame.

BACKGROUND OF THE INVENTION

A conventional semiconductor apparatus, which is fabricated using a BGA (Ball Grid Array) technique, includes a board frame, a semiconductor device (chip) and a mold package. Herein, the term "board frame" means a frame type of board or substrate that is used for fabricating semiconductor apparatuses. The board frame may employ a copper-plated-lamination structure. The semiconductor device is mounted on an island of the board frame. The semiconductor device is electrically connected at electrodes to inner leads provided on the board frame using a wire-bonding technique.

The board frame is provided at the bottom surface with solder balls. The inner leads are connected to outer leads using wires or through holes.

For a resin molding process, two major techniques, potting and transfer molding, are used. Transfer molding has been increasingly used, because semiconductor apparatuses can be easily fabricated with low costs, and mass production can be easily realized. The board frame can be provided as an individual piece, or as a frame, on which a number of semiconductor devices are mounted together. Frame types of boards (or substrates) have been increasingly employed for fabricating a transfer-mold type of semiconductor apparatuses.

In fabrication, the board frame with the semiconductor device is set between molding dies (die set). Then the molding resin is injected into the cavity at a predetermined pressure. As a result, the molding package is formed and the semiconductor device is sealed.

In recent years, as electric devices have been miniaturized, it has been required to miniaturize a package for semiconductor device as well. In order to miniaturize such a package, for example, the distance between the outer edge of the mold package and the outer edge of the board frame is shortened. However, the board frame must be mechanically held with the molding dies. Therefore, it is difficult to shorten such a distance.

In Japanese Patent Laying Open No. H9-252065, a wiring board region, which includes an island a semiconductor device is to be mounted on, is pushed off (removed) from a board frame, then the pushed off (removed) region is pushed back to the original position. After a transfer molding process, the wiring board region, which has been pushed back, is taken out from the board frame.

According to the conventional technology, shown in Japanese Patent Laying Open No. H9-252065, the wiring board region with the semiconductor device may have a difference in level from the remaining frame region. The level difference is caused by the push-back processing. The level difference may be in a range between 10 $\mu$m and 20 $\mu$m. According to the conventional method for push-back process, the wiring board region tends to be higher in level than the remaining frame region.

As it is difficult to control the level difference between the wiring board region and the remaining frame region, the yield rate of semiconductor apparatuses is lowered. When the level difference occurs between the wiring board region and the remaining frame region, it is difficult to carry out a wire bonding process properly and completely. Further, in a transfer molding process, thin burrs are made easily around the wiring board region.

As the wiring board region is pushed-back, the wiring region may drop out from the board frame. Especially when the gate is removed after the transfer molding process, the wiring board region easily drops out from the board frame. Consequently, according to the conventional technology, it is difficult to miniaturize a semiconductor apparatus without lowering the yield rate.

In this application, the term "push back" means a process of removing a region once from the board frame, then soon returning it to the original position.

OBJECTS OF THE INVENTION

Accordingly, an object of the present invention is to provide a board frame with which a semiconductor apparatus can be fabricated easily to be small in size without lowering the yield rate.

Another object of the present invention is to provide a method for fabricating a board frame, with which a semiconductor apparatus can be fabricated easily to be small in size without lowering the yield rate.

A further object of the present invention is to provide a semiconductor apparatus that can be fabricated easily to be small in size without lowering the yield rate.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a board frame includes a wiring board region, which includes an island on which a semiconductor device is to be mounted; and a marginal region surrounding the wiring board region. The board frame further includes a frame region, which is located around the marginal region; and a support region which connects the wiring board region and the frame region. The marginal region is removed from the board frame and is put back to its original position, while the wiring board region is maintained being connected to the frame region through the support region.

According to a second aspect of the present invention, a method for fabricating a board frame includes the step of providing on the board frame a wiring board region, which includes an island on which a semiconductor device is to be mounted. The method further includes the step of defining a marginal region which surrounds the wiring board region, a frame region that is located around the marginal region and a support region which extends between the wiring board region and the frame region through the marginal region so that the wiring board region and the frame region are connected to each other.

The method further includes the steps of removing the marginal region from the board frame and putting it back to its original position, while maintaining the wiring board region being connected to the frame region through the support region.

According to a third aspect of the present invention, a method for fabricating a semiconductor apparatus, which includes the step of providing on the board frame a wiring board region, which includes an island on which a semiconductor device is to be mounted. The method further includes the step of defining a marginal region which surrounds the wiring board region, a frame region that is located around the marginal region and a support region which extends between the wiring board region and the frame region through the marginal region so that the wiring board region and the frame region are connected to each other.

The method further includes the steps of removing the marginal region from the board frame and putting it back to its original position, while maintaining the wiring board region being connected to the frame region through the support region.

The method still further includes the steps of mounting the semiconductor device onto the island in the wiring board region; transfer-molding the semiconductor device using a die set, including a gate through which a thermosetting resin is guided in to a cavity thereof; and completely removing the marginal region from the board frame.

In each aspect of the present invention, preferably, the support region is shaped to have a width which is getting wider from the wiring board region toward the frame region.

As described above, according to the present invention, only the marginal region is pushed-back but the wiring board region is not pushed-back. The wiring board region is maintained being connected through the support region to the frame region. As a result, no level difference is made between the wiring board region and the frame region, and therefore, it is easy to carry out a wire bonding process properly and completely. Further, in a transfer molding process, thin burrs are not made easily around the wiring board region.

Further more, as the wiring board region is not pushed-back, the wiring board region does not drop out easily from the board frame. Consequently, semiconductor apparatuses can be fabricated easily to be small in size without lowering the yield rate.

DETAILED DISCLOSURE OF THE INVENTION

Figure 1:
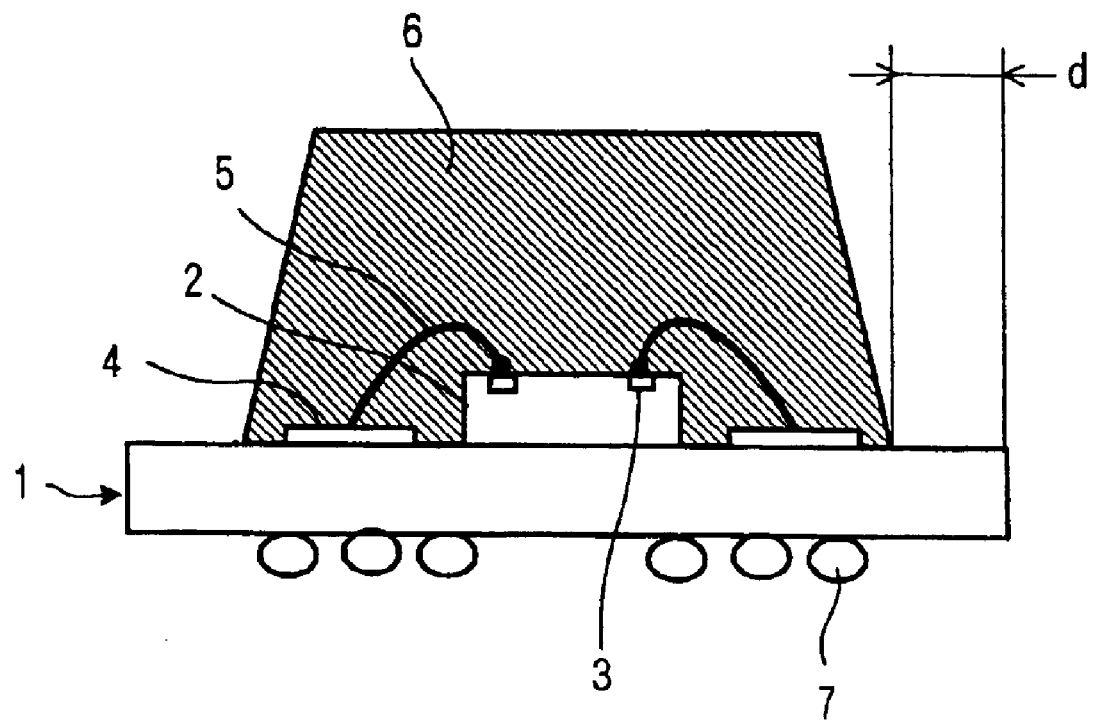
FIG. 1 is a cross-sectional view illustrating a conventional semiconductor apparatus.

For better understanding of the present invention, a conventional technology is first described. FIG. 1 shows a conventional semiconductor apparatus, which is fabricated using a BGA (Ball Grid Array) technique. The semiconductor apparatus includes a board frame 1, a semiconductor device (chip) 2 and a mold package 6. The board frame 1 may employ a copper-plated-lamination structure. The semiconductor device 2 is mounted on an island (not shown) of the board frame 1 using an adhesive. The semiconductor device 2 is electrically connected at electrodes 3 to inner leads 4 provided on the board frame 1 with a wire-bonding technique using bonding wires 5. The bonding wires 5 are thin metal wires, such as gold thin wires.

The mold package 6 is formed with epoxy resin by a transfer molding process. The board frame 1 is provided at the bottom surface with solder balls 7. The inner leads 4 are connected to outer leads using wires or through holes (not shown).

For a resin molding process, two major techniques, potting and transfer molding, are used. Transfer molding has been increasingly used, because semiconductor apparatuses can be easily fabricated with low costs, and mass production can be easily realized. The board frame 1 can be provided as an individual piece or a frame, on which a number of semiconductor devices are mounted together. Frame-type boards have been increasingly employed for fabricating transfer-mold types of semiconductor apparatuses.

Figure 2:
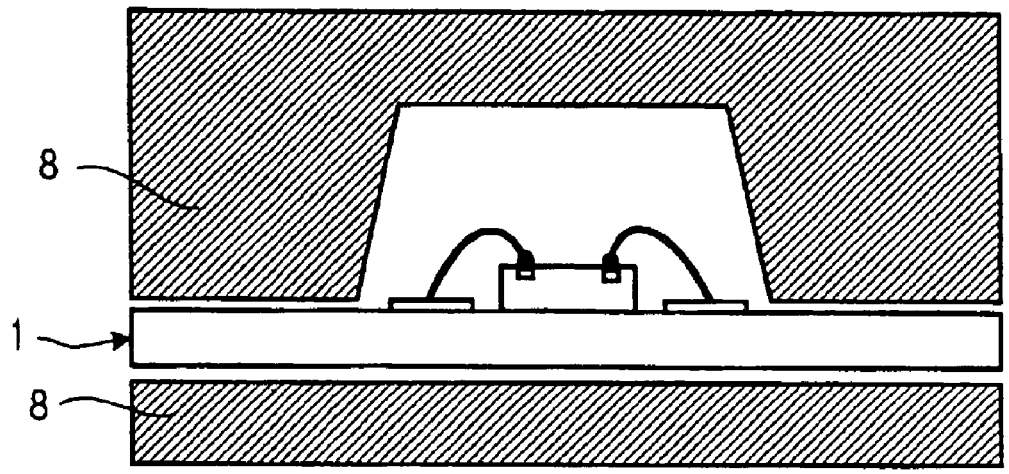
FIG. 2 is a cross-sectional view illustrating the conventional semiconductor apparatus, shown in FIG. 1, in a condition just before a transfer-molding process.
Figure 3:
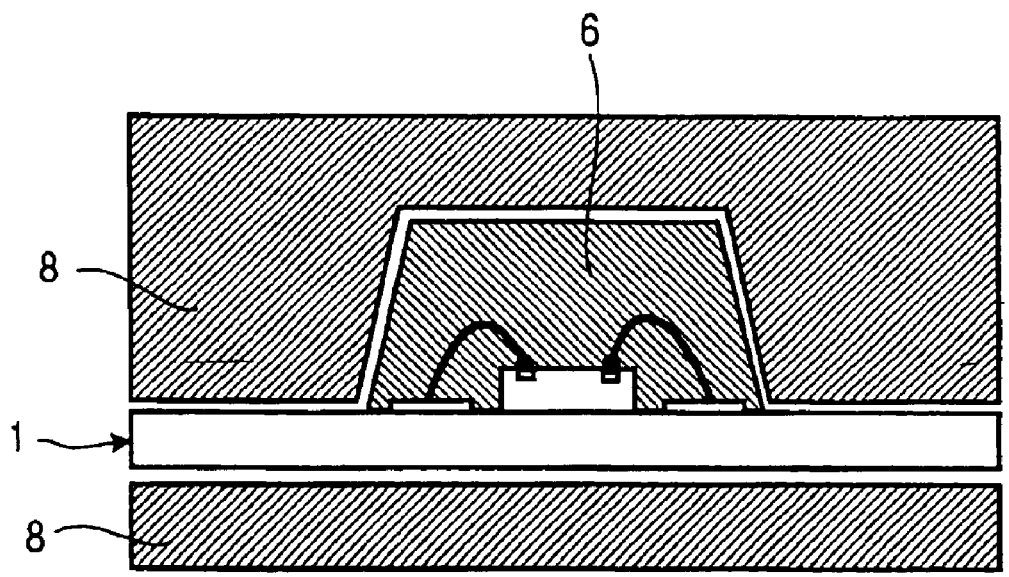
FIG. 3 is a cross-sectional view illustrating the conventional semiconductor apparatus, shown in FIG. 1, in a condition after the transfer-molding process.

FIG. 2 is a cross-sectional view showing the conventional semiconductor apparatus in a fabrication step, in which the board frame 1 is set between molding dies (die set) 8 for transfer-molding. FIG. 3 is a cross-sectional view showing the conventional semiconductor apparatus in a fabrication step, in which a molding resin is filled in a cavity.

As shown in FIG. 2, the board frame 1 with the semiconductor device 2 is arranged between the molding dies (die set) 8. Then the molding resin is controlled in temperature and is injected into the cavity at a predetermined pressure. As a result, the molding package 6 is formed and the semiconductor device 2 is sealed.

In recent years, as electric devices have been miniaturized, it has been required to miniaturize a package for semiconductor device as well. In order to miniaturize such a package, for example, a distance "d" between the outer edge of the mold package 6 and the outer edge of the board frame 1 is shortened. However, the board frame 1 must be mechanically held with the molding dies 8. Therefore, it is difficult to shorten the distance "d".

Accordingly, the edge of the board frame 1 is cut off with specific equipment or shaped in a mechanical process after the molding process. In Japanese Patent Laying Open No. H9-252065, a wiring board region, which includes an island a semiconductor device is to be mounted on, is pushed off from the board. Then the pushed off region is pushed back to the original position. After a transfer molding process, the wiring board region, which has been pushed back, is taken out from the board frame, so that the distance "d" can be close to zero.

According to the conventional technology, shown in Japanese Patent Laying Open No. H9-252065, the wiring board region with the semiconductor device may have a difference in level from the remaining frame region. The level difference is caused by the push-back processing. The difference may be in a range between 10 $\mu$m and 20 $\mu$m. According to the conventional method for the push-back process, the wiring board region tends to be higher in level than the remaining frame region.

As it is difficult to control the level difference between the wiring board region and the remaining frame region, the yield rate of semiconductor apparatuses is lowered. When the level difference is made between the wiring board region and the remaining frame region, it is difficult to carry out a wire bonding process properly and completely. Further, in a transfer molding process, thin burrs are made easily around the wiring board region.

Because the wiring board region is pushed-back, the wiring board region may drop out from the board frame. Especially when the gate is removed after the transfer molding process, the wiring board region easily drops out from the board frame. Consequently, according to the conventional technology, it is difficult to miniaturize a semiconductor apparatus without lowering the yield rate.

Figure 4:
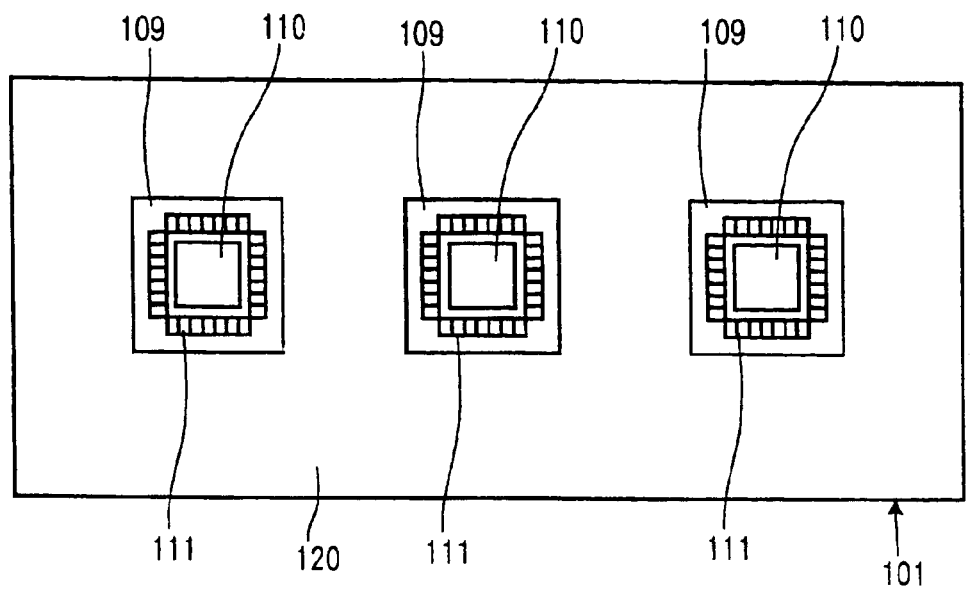
FIG. 4 is a plane view illustrating a board frame according to the present invention.
Figure 5:
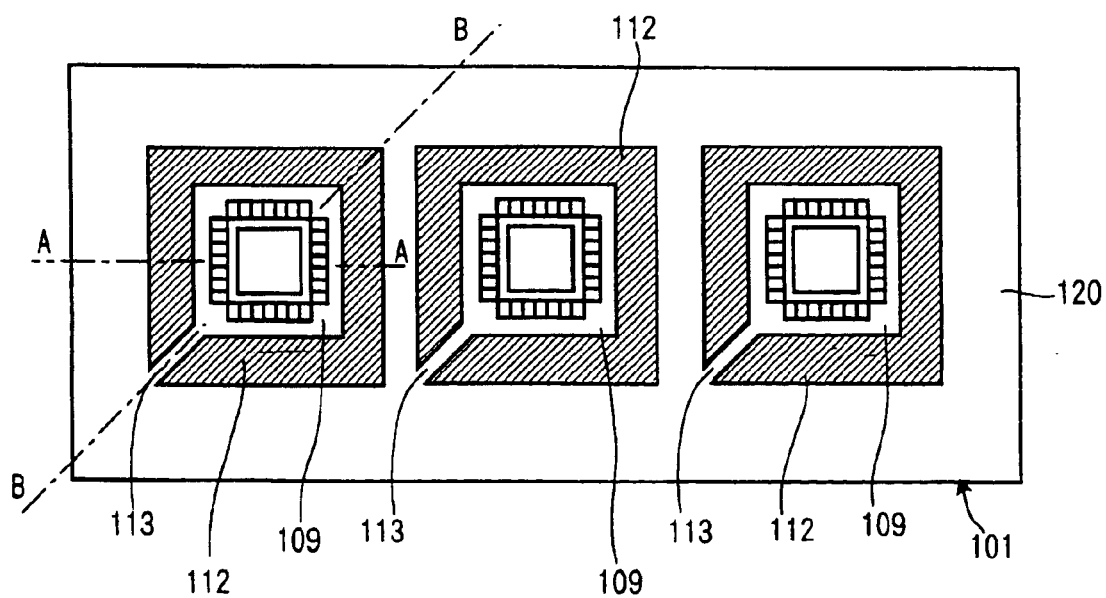
FIG. 5 is a plane view showing a board frame according to a first preferred embodiment of the present invention.

FIG. 4 is a plan view illustrating a board frame 101 according to a first preferred embodiment of the present invention. In FIG. 4, the board frame 101 is in the state before a push-back process. FIG. 5 is a plan view showing the board frame 101 in the condition after the push-back process. The board frame 101 includes three wiring board regions 109 and a frame region 120, which is located around the wiring board regions 109. The board frame 101 further includes for each wiring board region 109 a push-back region 112 (marginal region) and a support region 113. Each of the wiring board regions 109 is shaped to be as small as possible.

Although the drawings do not show, the board frame 101 is provided on the bottom surface with a wiring pattern and with connecting terminals. The board frame 101 can be provided with alignment holes, which are used for aligning and fixing the board frame 101. The board frame 101 may include slits used for preventing itself from being bent. FIGS. 4 and 5 do not show the inside structure of the board frame 101.

Each of the wiring board region 109 is shaped to be square, and is provided therein with an island 110, on which a semiconductor device is to be mounted, and inner leads 111 arranged around the island 110.

The support region 113 is arranged at a corner of the push-back region 112. The support region 113 connects the wiring board region 109 to the frame region 120 so that the push-back processing is not applied to the wiring board region 109 but only applied to the push-back region 112. The support region 113 extends from the wiring board region 109 outwardly through the push-back region 112 to the frame region 120 in the diagonal direction.

The push-back region 112 is shaped to be square to surround the wiring board region 109. The push-back region 112 includes an inner edge, which is defined by the outer edge of the wiring board region 109. The push-back region 112 is designed to be the optimum size based on a lot of parameters so that the push-back region 112 does not drop out from the board frame 101 undesirably. The parameters include the size of the board frame 101; the distance of the adjacent two wiring board regions 109, which is defined by the number of the wiring board regions; and an area for the above mentioned alignment holes and slits.

The push-back regions 112 and support regions 113, especially the width of the inside end of the support region 113, are designed to have appropriate sizes and shapes so that the push-back regions 112 are not removed away from the board frame 101. Those sizes and shapes are designed in accordance with the size of the board frame 101; the pitch (each distance) of the wiring board regions 109; and the locations of the alignment holes and slits. For example, the width of the inside end of each support region 113 is determined to be around 1.0 mm to 1.3 mm.

The board frame 101 is usually shaped to have a thickness in a range between 0.25 mm and 0.45 mm. The support region 113 can be formed not only at a corner of the push-back region 112 but at any location on the push-back region 112. The detail of fabrication steps of the board frame 101 will be described later in conjunction with FIGS. 14A to 14E.

According to the first preferred embodiment of the present invention, only the push-back regions 112 are pushed-back, while the wiring board regions 109 and the support regions 113 are not pushed-back. As a result, the wiring board regions 112 are maintained being connected through the support regions 113 to the frame region 120, and being the same level as the frame region 120.

As the wiring board regions 109 are maintained being the same level as the frame region 120, a wire bonding process can be carried out properly and completely on the wiring board regions 109. In a transfer molding process, no thin burr is made around the wiring board regions 109. Further, as the wiring board regions 109 are not pushed-back, the wiring board regions 109 do not drop out from the board frame 101. Consequently, the yield rate of semiconductor apparatuses is prevented from being lowered.

Figure 6A:
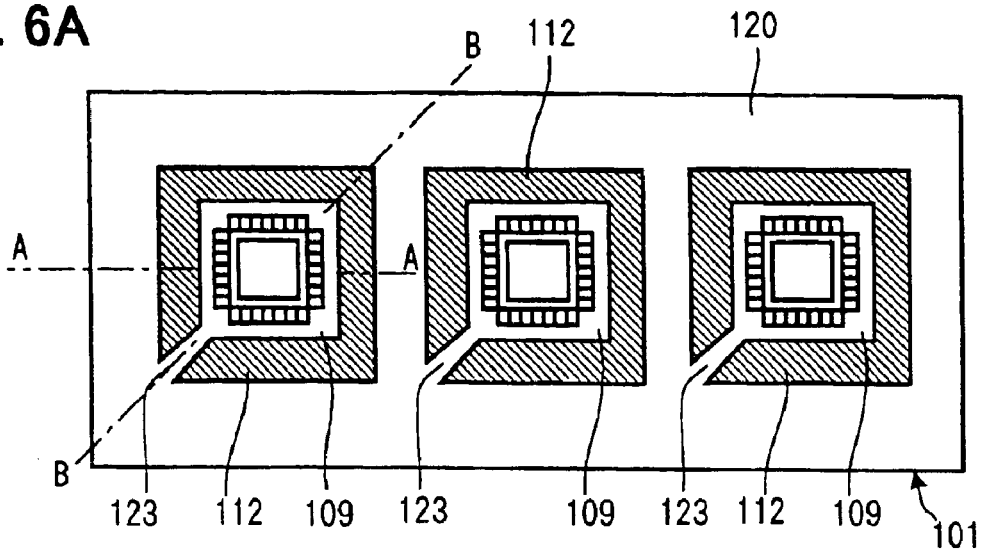
FIGS. 6A to 6C are plane views showing the steps of transfer molding for a board frame according to a second preferred embodiment of the present invention.
Figure 6B:
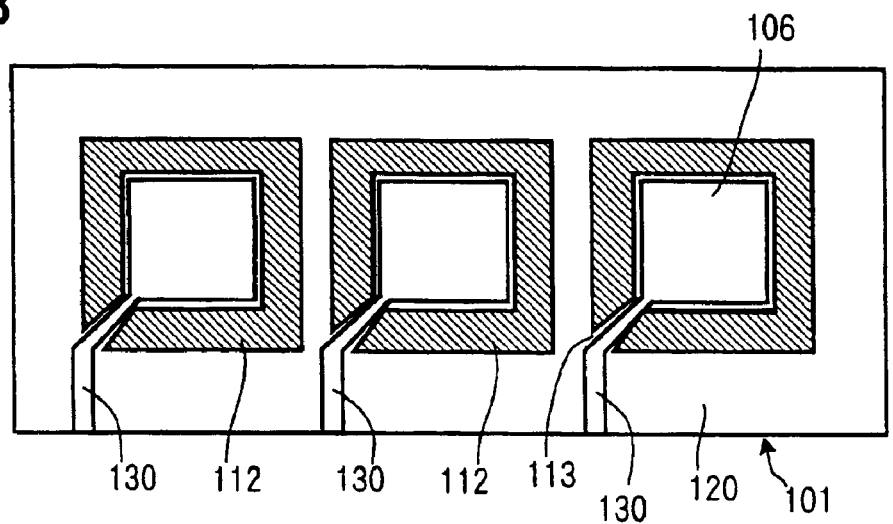
Figure 6C:
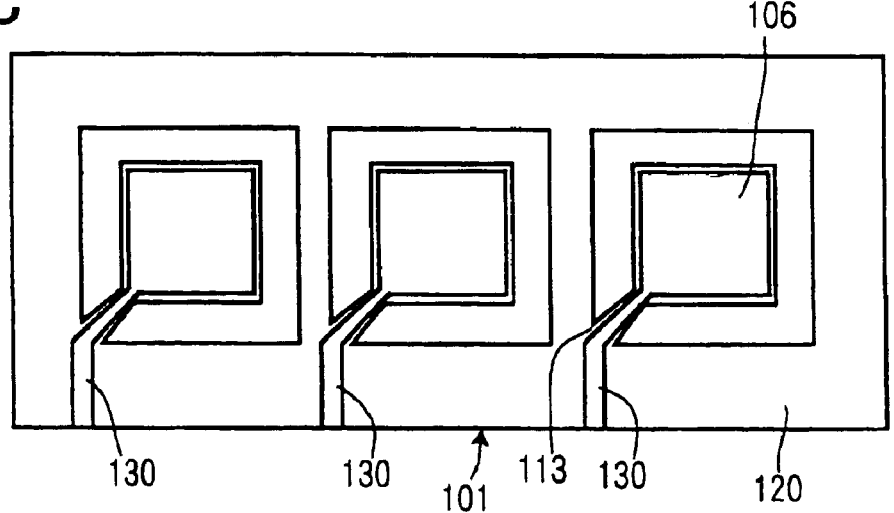

FIGS. 6A to 6C are plane views showing the steps for transfer molding process according to a second preferred embodiment of the invention. The second preferred embodiment is created by modifying the first preferred embodiment. The difference from the first preferred embodiment is that a support region 123 is located at a corner corresponding to a gate of a die set used in a transfer molding process, and the support region 123 is designed to have a width that is getting wider from the wiring board region 109 toward the frame region 120. In the second preferred embodiment, the same or corresponding components to the first preferred embodiment are represented by the same reference numerals. To avoid redundant explanation, the same description is not repeated.

In fabrication, as shown in FIG. 6A, a wiring board region 109, a push-back region 112 and a support region 123 are provided (defined). Then, the push-back region 112 is pushed-back. That is, the push-back region 112 is removed, and is put back its original position. Next, as shown in FIG. 6B, a transfer molding process is carried out to the semiconductor devices on the board frame 101. In FIG. 6B, a reference numeral 130 represents a remaining resin at a gate of a die set used in the transfer molding process. Next, as shown in FIG. 6C, the push-back region 112 is completely removed from the board frame 101.

The detail of fabrication steps of the board frame 101 will be described later in conjunction with FIGS. 14A to 14E.

According to the second preferred embodiment of the present invention, only the push-back regions 112 are pushed-back, while the wiring board regions 109 and the support regions 123 are not pushed-back. As a result, the wiring board regions 112 are maintained being connected through the support regions 123 to the frame region 120, and being the same level as the frame region 120.

As the wiring board regions 109 are maintained being the same level as the frame region 120, a wire bonding process can be carried out properly and completely on the wiring board regions 109. In a transfer molding process, no thin burr is made around the wiring board regions 109. Further, as the wiring board regions 109 are not pushed-back, the wiring board regions 109 do not drop out from the board frame 101. Consequently, the yield rate of semiconductor apparatuses is prevented from being lowered.

Still further, as the support regions 123, located at the corner corresponding to the gates of the die set, are not pushed-back, a relatively large amount of molding resin remains at the gate areas 130, and therefore, the support regions 123 effectively and strongly support the wiring board regions 109.

Figure 7:
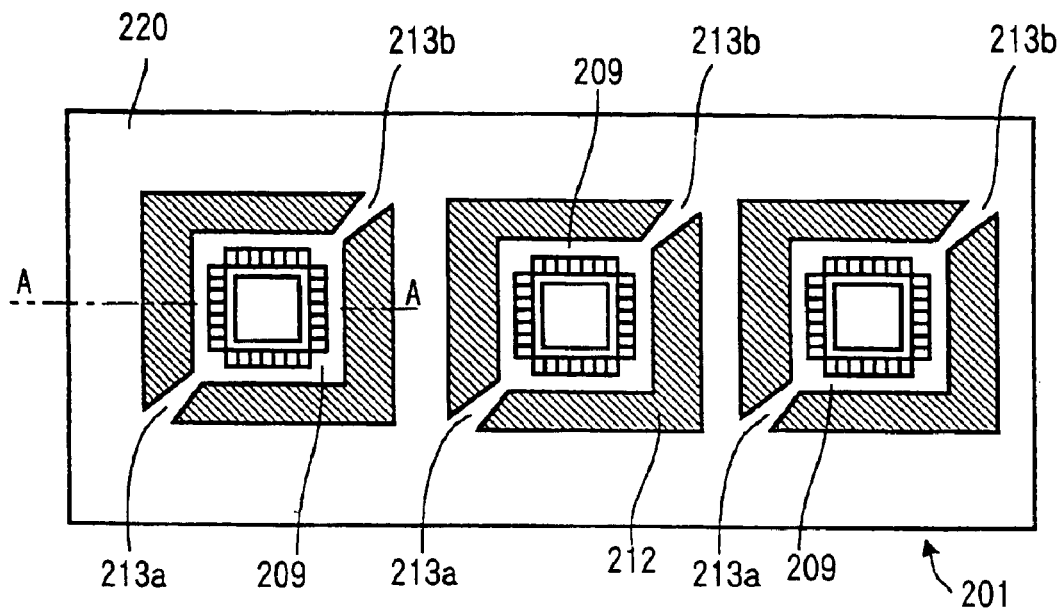
FIG. 7 is a plane view showing a board frame according to a third preferred embodiment of the present invention.

FIG. 7 is a plane view showing a board frame 201 according to a third preferred embodiment of the present invention. The board frame 201 includes three wiring board regions 209 and a frame region 220, which is located around the wiring board regions 209. The board frame 201 further includes for each wiring board region 209 a push-back region 212 (marginal region) and support regions 213a and 213b. Each of the wiring board regions 209 is shaped to be as small as possible.

Each of the wiring board regions 209 is shaped to be square, and is provided therein with an island, on which a semiconductor device is to be mounted, and inner leads arranged around the island.

The support regions 213a and 213b are arranged at diagonal corners of the push-back region 212. The support regions 213a and 213b connect the wiring board region 209 to the frame region 220 so that the push-back processing is not applied to the wiring board region 209 but only applied to the push-back region 212. Each of the support regions 213a and 213b extends from the wiring board region 209 outwardly through the push-back region 212 to the frame region 220 in the diagonal direction. The support region 213a is located at a corner corresponding to a gate of a die set used in a transfer molding process. Each of the support regions 213a and 213b is designed to have a width that is getting wider from the wiring board region 209 toward the frame region 220.

The push-back region 212 is shaped to be square to surround the wiring board region 209. The push-back region 212 includes an inner edge, which is defined by the outer edge of the wiring board region 209.

According to the third preferred embodiment of the present invention, only the push-back regions 212 are pushed-back, while the wiring board regions 209 and the support regions 213a and 213b are not pushed-back. As a result, the wiring board regions 209 are maintained being connected through the support regions 213a and 213b to the frame region 220, and being the same level as the frame region 220.

As the wiring board regions 209 are maintained being the same level as the frame region 220, a wire bonding process can be carried out properly and completely on the wiring board regions 209. In a transfer molding process, no thin burr is made around the wiring board regions 209. Further, as the wiring board region 209 is not pushed-back, the wiring board regions 209 do not drop out from the board frame 201. Consequently, the yield rate of semiconductor apparatuses is prevented from being lowered.

Still further, as the support regions 213a, located at the corner corresponding to the gate of the die set, are not pushed-back, a relatively large amount of molding resin remains thereat, and therefore, the support regions 213a effectively and strongly support the wiring board regions 209. According to the third preferred embodiment, the support regions 213b are located in diagonal relative to the support regions 213a. Therefore, in the transfer molding process, it is secured that air in the cavity of the die set goes out smoothly. As the two support regions 213a and 213b are provided in each of the push-back regions 212, the wiring board regions 209 are supported firmly.

Figure 8:
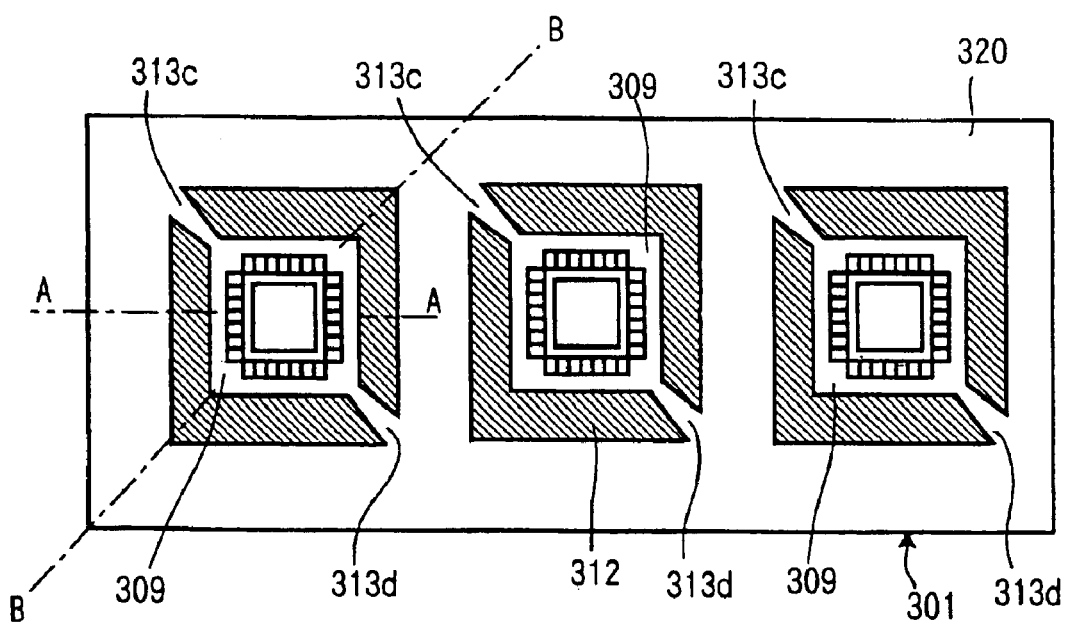
FIG. 8 is a plane view showing a board frame according to a fourth preferred embodiment of the present invention.

FIG. 8 is a plane view showing a board frame 301 according to a fourth preferred embodiment of the present invention. The board frame 301 includes three wiring board regions 309 and a frame region 320, which is located around the wiring board regions 309. The board frame 301 further includes for each wiring board region 309 a push-back regions 312 (marginal regions) and support regions 313c and 313d. Each of the wiring board regions 309 is shaped to be as small as possible.

Each of the wiring board regions 309 is shaped to be square, and is provided therein with an island, on which a semiconductor device is to be mounted, and inner leads arranged around the island.

The support regions 313c and 313d are arranged at diagonal corners of each of the push-back region 312. The support regions 313c and 313d connect the wiring board region 309 to the frame region 320 so that the push-back processing is not applied to the wiring board region 309 but only applied to the push-back region 312. Each of the support regions 313c and 313d extends from the wiring board region 309 outwardly through the push-back region 312 to the frame region 320 in the diagonal direction.

Neither the support region 313c nor 313d is located at a corner corresponding to a gate of a die set used in a transfer molding process. Each of the support regions 313c and 313d is designed to have a width that is getting wider from the wiring board region 309 toward the frame region 320.

Each of the push-back regions 312 is shaped to be square to surround the wiring board region 309. Each of the push-back regions 312 includes an inner edge, which is defined by the outer edge of the wiring board region 309.

According to the fourth preferred embodiment of the present invention, only the push-back regions 312 are pushed-back, while the wiring board regions 309 and the support regions 313c and 313d are not pushed-back. As a result, the wiring board regions 309 are maintained being connected through the support regions 313c and 313d to the frame region 320, and being the same level as the frame region 320.

As the wiring board regions 309 are maintained being the same level as the frame region 320, a wire bonding process can be carried out properly and completely on the wiring board regions 309. In a transfer molding process, no thin burr is made around the wiring board regions 309. Further, as the wiring board region 309 is not pushed-back, the wiring board regions 309 do not drop out from the board frame 301. Consequently, the yield rate of semiconductor apparatuses is prevented from being lowered.

As the area corresponding to the gate of die set is pushed-back, a thermosetting resin remaining at the gate can be easily removed after the transfer molding process. As the two support regions 313c and 313d are provided in each of the push-back regions 312, the wiring board regions 309 are supported with enough mechanical strength.

Figure 9:
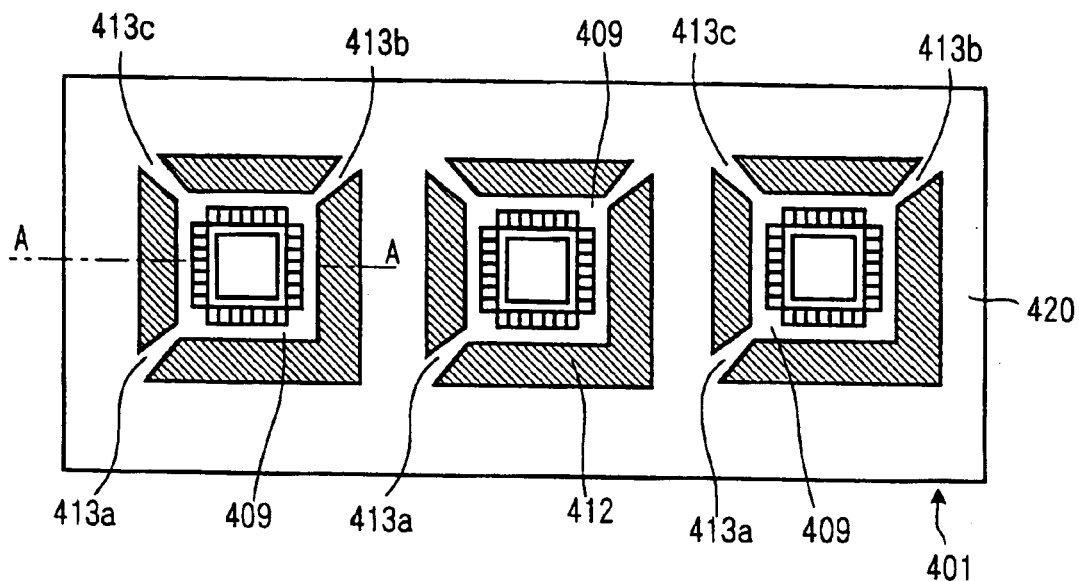
FIG. 9 is a plane view showing a board frame according to a fifth preferred embodiment of the present invention.

FIG. 9 is a plane view showing a board frame 401 according to a fifth preferred embodiment of the present invention. The board frame 401 includes three wiring board regions 409 and a frame region 420, which is located around the wiring board regions 409. The board frame 401 further includes for each wiring board region 409 a push-back region 412 (marginal region) and support regions 413a, 413b and 413c. Each of the wiring board regions 409 is shaped to be as small as possible.

Each of the wiring board regions 409 is shaped to be square, and is provided therein with an island, on which a semiconductor device is to be mounted, and inner leads arranged around the island.

The support regions 413a, 413b and 413c are arranged at three corners of the push-back region 412. The support regions 413a, 413b and 413c connect the wiring board region 409 to the frame region 420 so that the push-back processing is not applied to the wiring board region 409 but only applied to the push-back region 412.

Each of the support regions 413a, 413b and 413c extends from the wiring board region 409 outwardly through the push-back region 412 to the frame region 420 in the diagonal direction. The support region 413a is located at an corner corresponding to a gate of a die set used in a transfer molding process. Each of the support regions 413a, 413b and 413c is designed to have a width that is getting wider from the wiring board region 409 toward the frame region 420.

Each of the push-back region 412 is shaped to be square to surround the wiring board region 409. Each of the push-back region 412 includes an inner edge, which is defined by the outer edge of the wiring board region 409.

According to the fifth preferred embodiment of the present invention, only the push-back regions 412 are pushed-back, while the wiring board regions 409 and the support regions 413a, 413b and 413c are not pushed-back. As a result, the wiring board regions 409 are maintained being connected through the support regions 413a, 413b and 413c to the frame region 420, and being the same level as the frame region 420.

As the wiring board regions 409 are maintained being the same level as the frame region 420, a wire bonding process can be carried out properly and completely on the wiring board regions 409. In a transfer molding process, no thin burr is made around the wiring board regions 409. Further, as the wiring board region 409 is not pushed-back, the wiring board regions 409 do not drop out from the board frame 401. Consequently, the yield rate of semiconductor apparatuses is prevented from being lowered.

Still further, as the support regions 413a are not pushed-back, a relatively large amount of molding resin remains at the gate area, and therefore, the support regions 413a effectively and firmly support the wiring board regions 409. According to the fifth preferred embodiment, the support regions 413a, 413b and 413c are located at three corners of the push-back region 412 including the corner corresponding to the gate of die set, so that air in the cavity of the die set goes out smoothly in the transfer molding process. Thus, the transfer molding process can be carried out precisely.

Figure 10:
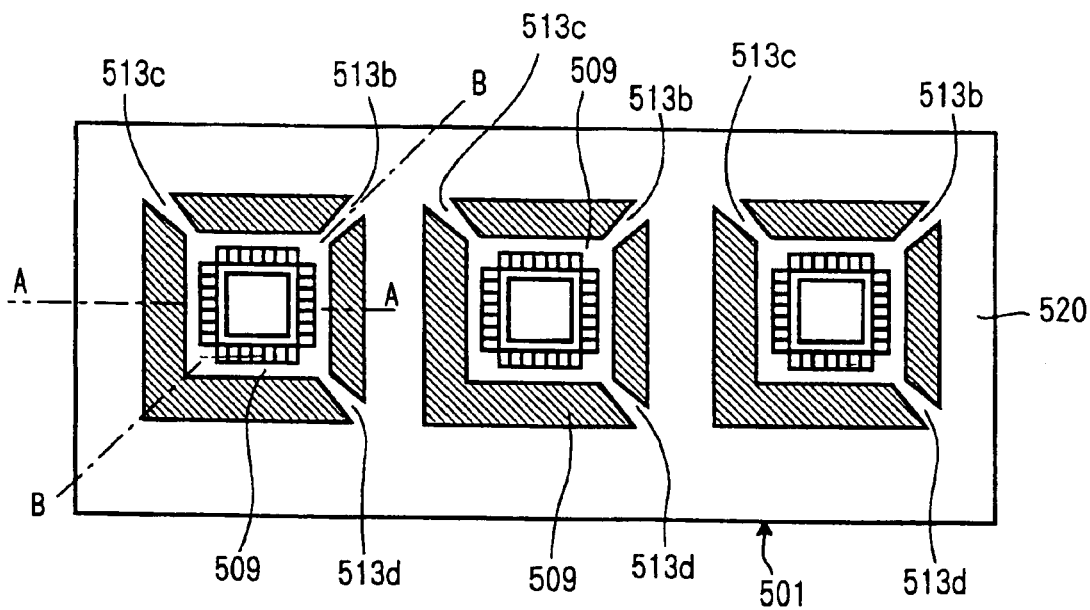
FIG. 10 is a plane view showing a board frame according to a sixth preferred embodiment of the present invention.

FIG. 10 is a plane view showing a board frame 501 according to a sixth preferred embodiment of the present invention. The board frame 501 includes three wiring board regions 509 and a frame region 520, which is located around the wiring board regions 509. The board frame 501 further includes for each wiring board region 509 a push-back regions 512 (marginal regions) and support regions 513b, 513c and 513d. Each of the wiring board regions 509 is shaped to be as small as possible.

Each of the wiring board regions 509 is shaped to be square, and is provided therein with an island, on which a semiconductor device is to be mounted, and inner leads arranged around the island.

The support regions 513b, 513c and 513d are arranged at three corners of each of the push-back region 512. The support regions 513b, 513c and 513d connect the wiring board region 509 to the frame region 520 so that the push-back processing is not applied to the wiring board region 509 but only applied to the push-back region 512. Each of the support regions 513b, 513c and 513d extends from the wiring board region 509 outwardly through the push-back region 512 to the frame region 520 in the diagonal direction.

None of the support regions 513b, 513c and 513d is located at a corner corresponding to a gate of a die set used in a transfer molding process. Each of the support regions 513b, 513c and 513d is designed to have a width that is getting wider from the wiring board region 509 toward the frame region 520.

Each of the push-back regions 512 is shaped to be square to surround the wiring board region 509. Each of the push-back regions 512 includes an inner edge, which is defined by the outer edge of the wiring board region 509.

According to the sixth preferred embodiment of the present invention, only the push-back regions 512 are pushed-back, while the wiring board regions 509 and the support regions 513b, 513c and 513d are not pushed-back. As a result, the wiring board regions 509 are maintained being connected through the support regions 513b, 513c and 513d to the frame region 520, and being the same level as the frame region 520.

As the wiring board regions 509 are maintained being the same level as the frame region 520, a wire bonding process can be carried out properly and completely on the wiring board regions 509. In a transfer molding process, no thin burr is made around the wiring board regions 509. Further, as the wiring board region 509 is not pushed-back, the wiring board regions 509 do not drop out from the board frame 501. Consequently, the yield rate of semiconductor apparatuses is prevented from being lowered.

As the area corresponding to the gate of die set is pushed-back, a thermosetting resin remaining at the gate can be easily removed after the transfer molding process.

Figure 11:
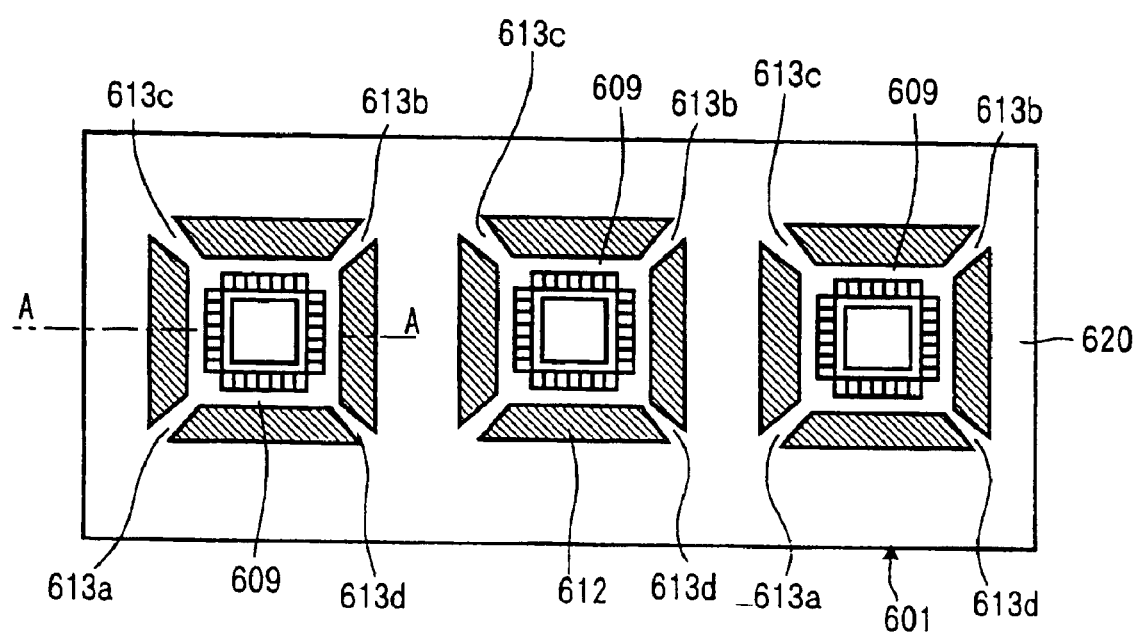
FIG. 11 is a plane view showing a board frame according to a seventh preferred embodiment of the present invention.

FIG. 11 is a plane view showing a board frame 601 according to a seventh preferred embodiment of the present invention. The board frame 601 includes three wiring board regions 609 and a frame region 620, which is located around the wiring board regions 609. The board frame 601 further includes for each wiring board region 609 a push-back region 612 (marginal region) and support regions 613a, 613b, 613c and 613d. Each of the wiring board regions 609 is shaped to be as small as possible.

Each of the wiring board regions 609 is shaped to be square, and is provided therein with an island, on which a semiconductor device is to be mounted, and inner leads arranged around the island.

The support regions 613a, 613b, 613c and 613d are arranged at the corners of the push-back region 612. The support regions 613a, 613b, 613c and 613d connect the wiring board region 609 to the frame region 620 so that the push-back processing is not applied to the wiring board region 609 but only applied to the push-back region 612.

Each of the support regions 613a, 613b, 613c and 613d extends from the wiring board region 609 outwardly through the push-back region 612 to the frame region 620 in the diagonal direction. The support region 613a is located corresponding to a gate of a die set used in a transfer molding process. Each of the support regions 613a, 613b, 613c and 613d is designed to have a width that is getting wider from the wiring board region 609 toward the frame region 620.

Each of the push-back region 612 is shaped to be square to surround the wiring board region 609. Each of the push-back region 612 includes an inner edge, which is defined by the outer edge of the wiring board region 609.

According to the seventh preferred embodiment of the present invention, only the push-back regions 612 are pushed-back, while the wiring board regions 609 and the support regions 613a, 613b, 613c and 613d are not pushed-back. As a result, the wiring board regions 609 are maintained being connected through the support regions 613a, 613b, 613c and 613d to the frame region 620, and being the same level as the frame region 620.

As the wiring board regions 609 are maintained being the same level as the frame region 620, a wire bonding process can be carried out properly and completely on the wiring board regions 609. In a transfer molding process, no thin burr is made around the wiring board regions 609. Further, as the wiring board region 609 is not pushed-back, the wiring board regions 609 do not drop out from the board frame 601. Consequently, the yield rate of semiconductor apparatuses is prevented from being lowered.

Figure 12:
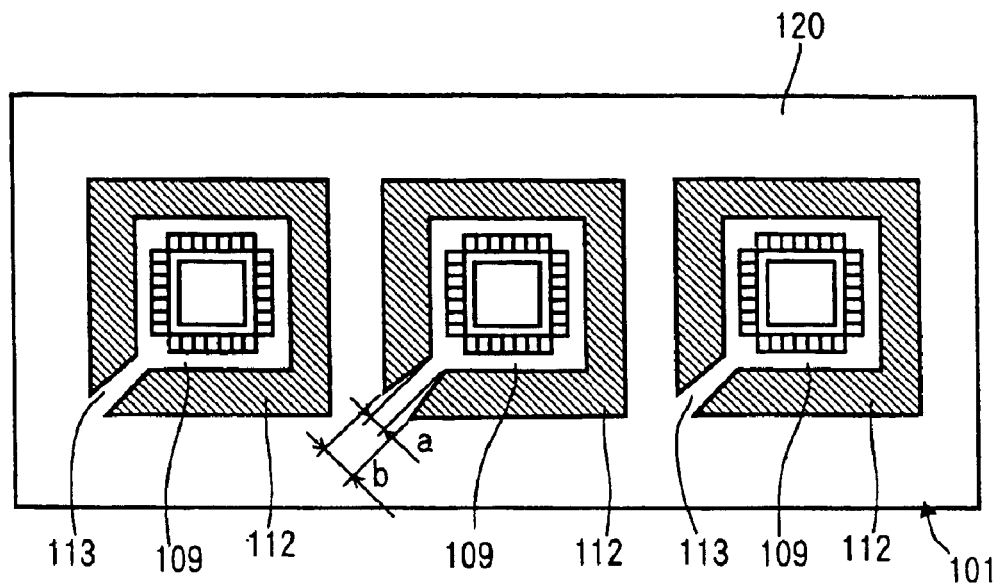
FIG. 12 is a plane view showing an example of a board frame according to an eighth preferred embodiment of the present invention.

Still further, the support regions 613a, 613b, 613c and 613d are located at all the corners of the push-back region 612, so that air in the cavity of the die set goes out smoothly in the transfer molding process. Thus, the transfer molding process can be carried out precisely. The wiring board regions 609 are supported stably at four points, so that a large area type of semiconductor apparatus can be supported. In other words, each support region can be designed to be thinner (narrower). Molding resin remaining at the gate area of the die set can be removed easily, because the support region 613a is not pushed back FIG. 12 is a plane view showing an example of a board frame according to an eighth preferred embodiment of the present invention. This embodiment is applied to the board frame shown in FIG. 5. In this embodiment, the same or corresponding components to the first preferred embodiment are represented by the same reference numerals.

The feature of the eighth preferred embodiment is to control the size of support regions 113 precisely. Each of the support region 113 is designed to have an inner width "a", connected to a wiring board region 109, and an outer width "b", connected to a frame region 120. The outer width "b" is designed to be larger than the inner width "a". For example, the inner width "a" and the outer width "b" are designed to be 1 mm and 3 mm, respectively.

According to the eighth preferred embodiment, the push back regions 112 are not easily drop out from the board frame. Further, it can be possible to reduce mechanical stress applied to the wiring board regions 109 when the support regions 113 are removed from the board frame 101 in the final process.

Figure 13:
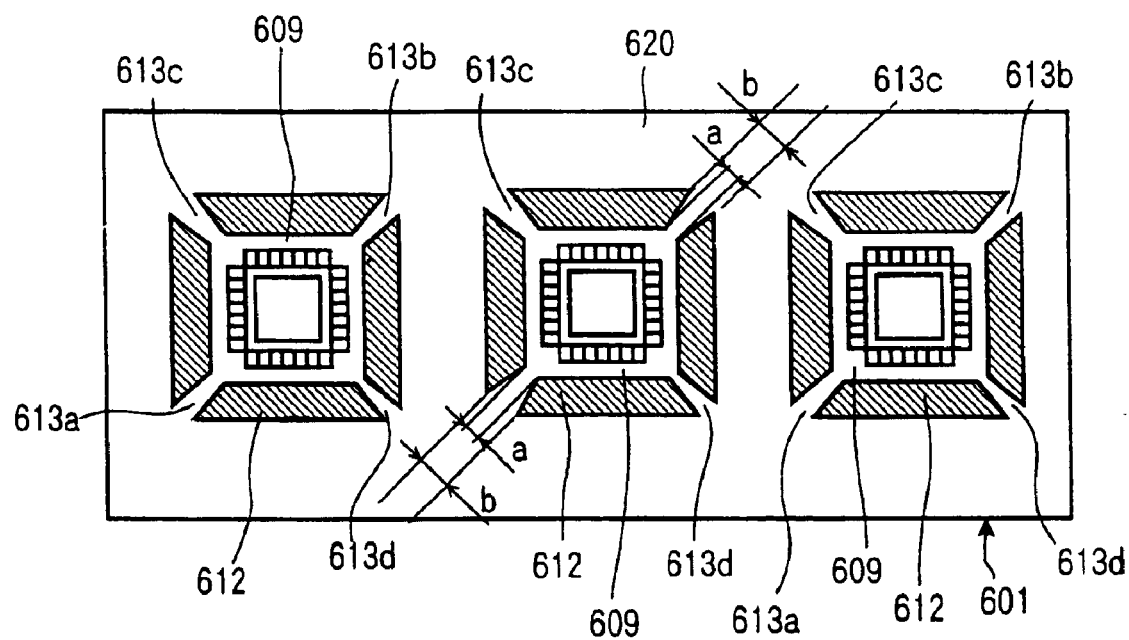
FIG. 13 is a plane view showing an example of a board frame according to a ninth preferred embodiment of the present invention.

FIG. 13 is a plane view showing an example of a board frame according to a ninth preferred embodiment of the present invention. This embodiment is applied to the board frame shown in FIG. 11. In this embodiment, the same or corresponding components to the seventh preferred embodiment are represented by the same reference numerals.

The feature of the ninth preferred embodiment is to control the size of support regions 613a, 613b, 613c and 613d precisely. Each of the support region 613a, 613b, 613c and 613d is designed to have an inner width "a", connected to a wiring board region 609, and an outer width "b", connected to a frame region 620. The outer width "b" is designed to be larger than the inner width "a". For example, the inner width "a" and the outer width "b" are designed to be 1 mm and 3 mm, respectively.

According to the ninth preferred embodiment, the push back regions 612 are not easily drop out from the board frame. Further, it can be possible to reduce mechanical stress applied to the wiring board regions 609 when the support regions 613a, 613b, 613c and 613d are removed from the board frame 601 in the final process.

Figure 14A:
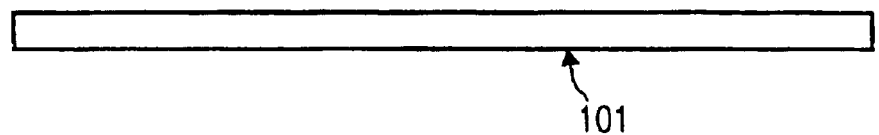
FIGS. 14A to 14E are cross-sectional views showing the fabrication steps of a board frame, according to the first to eighth preferred embodiments of the present invention.
Figure 14B:
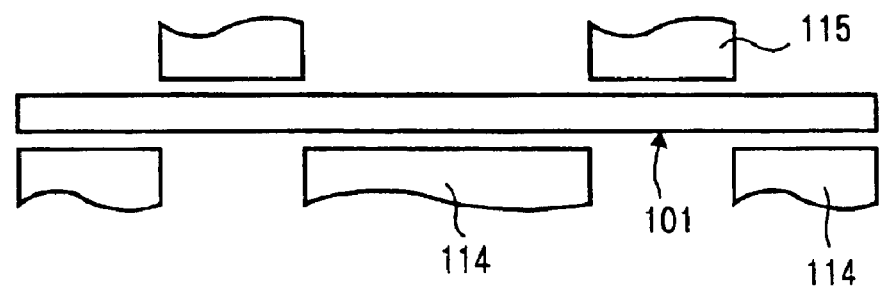

FIGS. 14A to 14E show the fabrication steps of a board frame, corresponding to each of the first to eighth preferred embodiments of the present invention. For easy understanding, the first preferred embodiment is picked up as an example, as shown in FIGS. 14A to 14E. FIG. 14A shows a board frame 101, to which necessary processes have been applied, such as patterning and laminating. The board frame 101 is put on a lower die 114 for a push-back process, as shown in FIG. 14B.

Figure 14C:
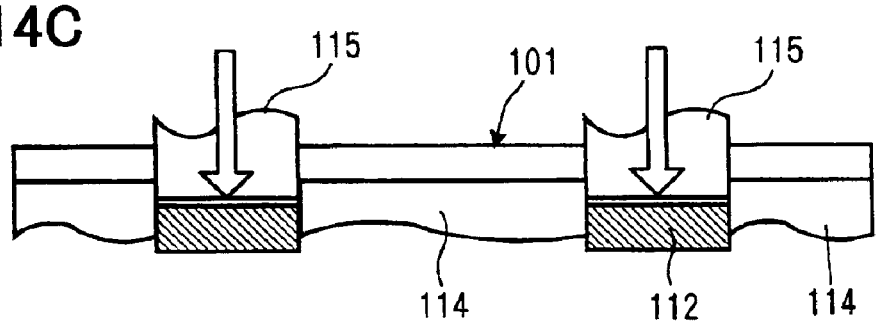
Figure 14D:
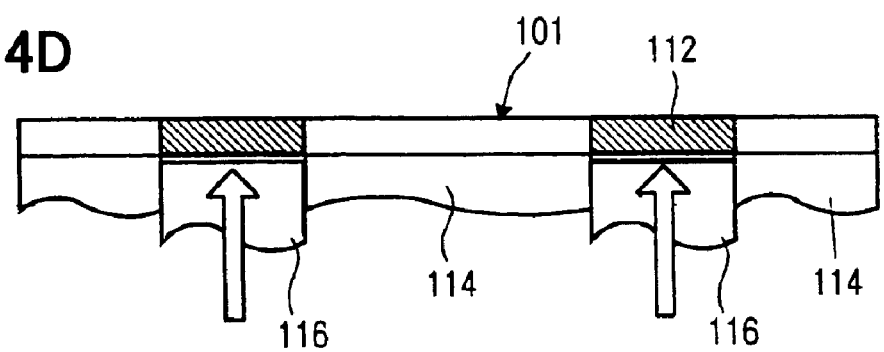
Figure 14E:
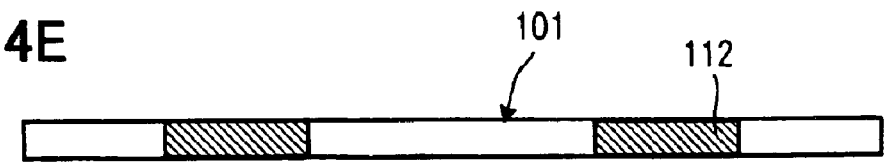

An upper punch 115 is aligned above the board frame 101. The board frame 101 is punched out at a push-back region 112 with the upper punch 115, as shown in FIG. 14C. The push-back region 112 is pushed up back to the original position with a lower punch 116, as shown in FIG. 14D. FIG. 14E shows the board frame 101 to which the push-back process has been applied.

According to the method for push-back, the board frame 101 is easily pushed back only with the die 114 and punches 115 and 116. Although the board frame 101 can be placed on the die 114 either with the face upward or downward, preferably the frame 101 is placed with the face upward. The face of the board frame 101 means the surface on which a semiconductor device is to be mounted.

Figure 15A:
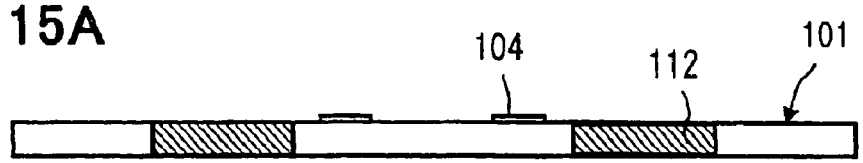
FIGS. 15A to 15E are cross-sectional views corresponding to views taken on line A—A in FIG. 5, showing the fabrication steps of a semiconductor apparatus using the board frame according to the first preferred embodiment of the present invention.

FIGS. 15A to 15E are cross-sectional views taken on line A—A in FIG. 5, showing the fabrication steps of a semiconductor apparatus using the board frame according to the first to eight preferred embodiments of the present invention. For easy understanding, the board frame 101 shown in FIG. 5 is picked up as an example. FIG. 15A shows the board frame 101 in which push-back regions 112 have been pushed-back already.

Figure 15B:
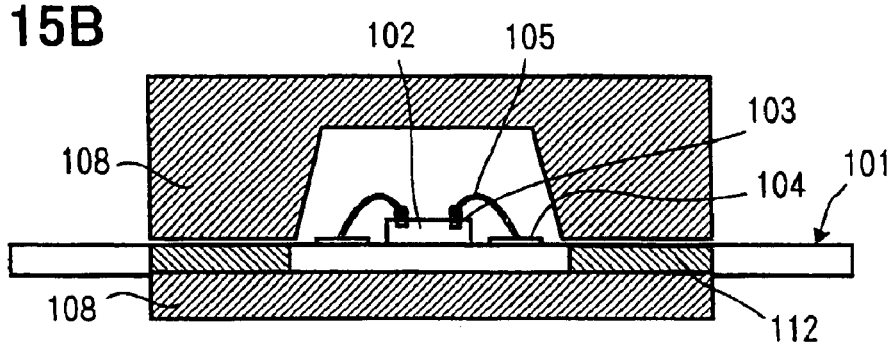

In fabrication, first, a semiconductor device 102 is fixed with an adhesive onto an island provided on the board frame 101, as shown in FIG. 15B. Then, electrodes 103 on the semiconductor device 102 are connected to inner leads 104 on the board frame 101 with bonding wires 105. The board frame 101 is set between upper and lower dies 108. The upper die 108 includes a cavity therein.

Figure 15C:
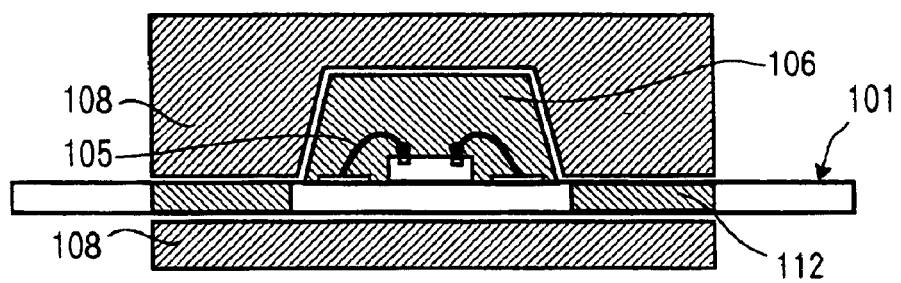
Figure 15D:
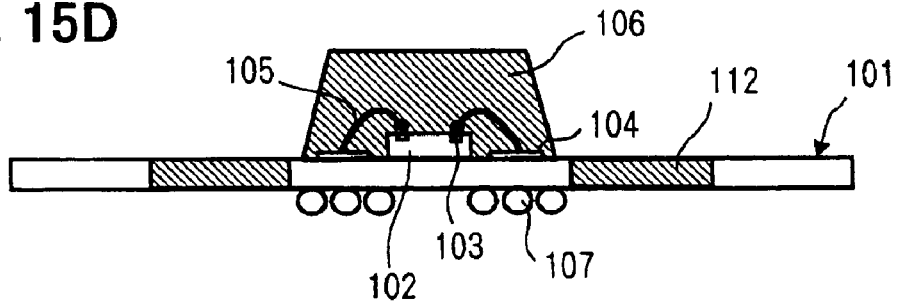
Figure 15E:
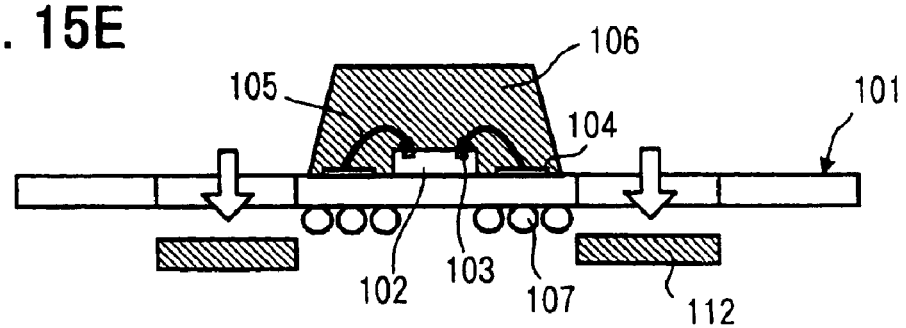

Next, as shown in FIG. 15C, a thermosetting resin is softened and injected into the cavity according to a transfer molding technique to form a resin package 106 over the semiconductor device 102. After that, the molding dies 108 are taken out. Next, solder balls 107 are provided on the bottom surface of the board frame 101, as shown in FIG. 15D. Next, the push-back regions 112 are removed from the board frame 101, as shown in FIG. 15E.

FIGS. 16A to 16E are cross-sectional views taken on line B—B in FIGS. 6A to 6C, showing the fabrication steps of a semiconductor apparatus using the board frame according to the second preferred embodiment of the present invention. As shown in FIGS. 6A to 6C, the board frame 101 includes a support region 123 arranged at an area corresponding to a gate of a die set used in a transfer molding process. In other words, the area corresponding to the gate is not pushed back.

Figure 16A:
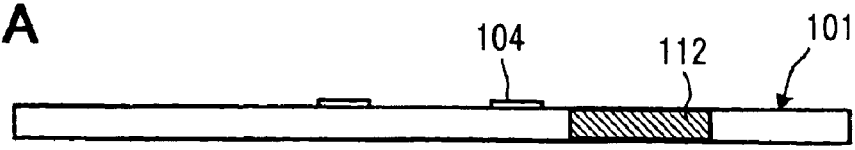
FIGS. 16A to 16E are cross-sectional views taken on line B—B in FIGS. 6A to 6C, showing the fabrication steps of a semiconductor apparatus using the board frame according to the second preferred embodiment of the present invention.

FIG. 16A shows the board frame 101 in which push-back regions 112 have been pushed-back already.

Figure 16B:
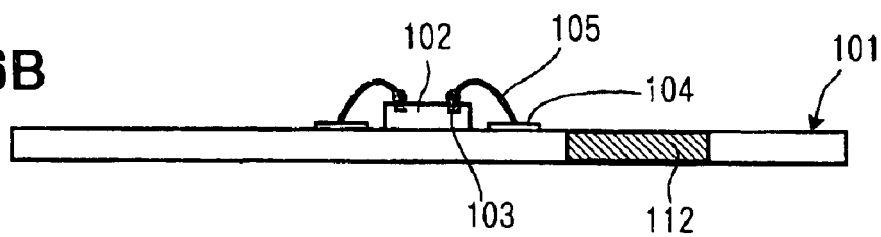
Figure 16C:
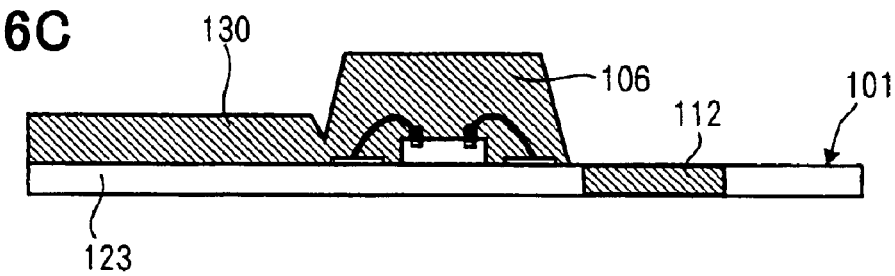

In fabrication, first, a semiconductor device 102 is fixed with an adhesive onto an island provided on the board frame 101, as shown in FIG. 16B. Then, electrodes 103 on the semiconductor device 102 are connected to inner leads 104 on the board frame 101 with bonding wires 105. Next, as shown in FIG. 16C, a resin package 106 is formed over the semiconductor device 102 according to a transfer molding technique.

Figure 16D:
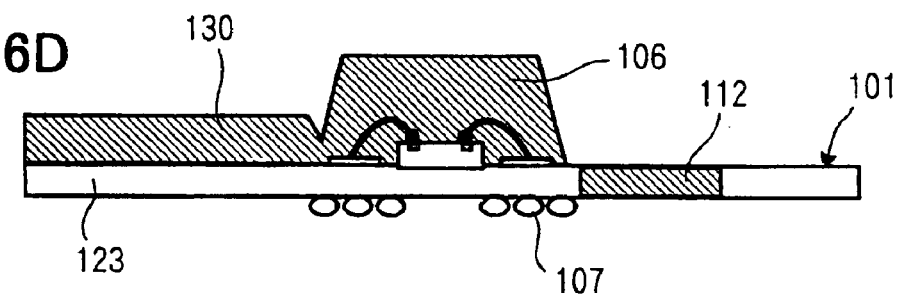
Figure 16E:
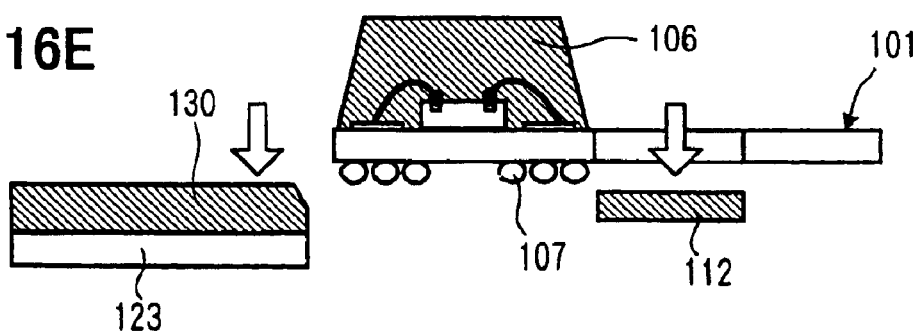

After that, solder balls 107 are provided on the bottom surface of the board frame 101, as shown in FIG. 16D. Next, the push-back regions 112 are removed from the board frame 101, as shown in FIG. 16E. Then, the support region (non pushed-back region) 123 is removed together with unnecessary resin from the board frame 101.

Either of the push back region 112 or the support region 123 can be removed first, or both can be removed at the same time. The push back region 112 and the support region 123 may be removed mechanically using punches.

Figure 17A:
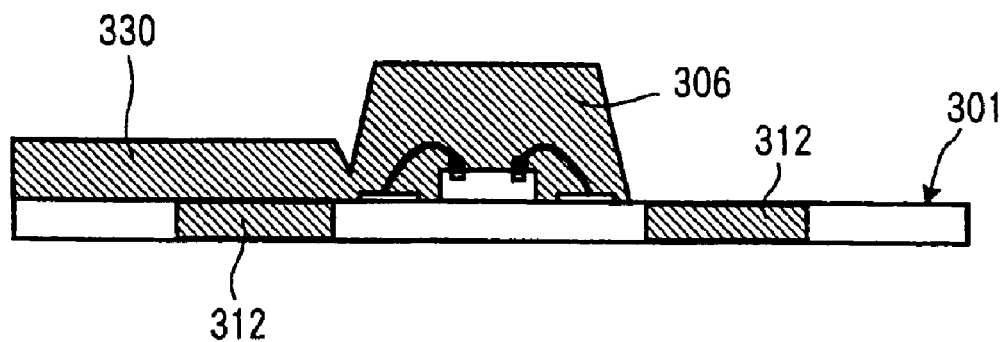
FIGS. 17A to 17C are cross-sectional views taken on line B—B in FIG. 8, showing the fabrication steps of a semiconductor apparatus using the board frame according to the fourth preferred embodiment of the present invention.
Figure 17B:
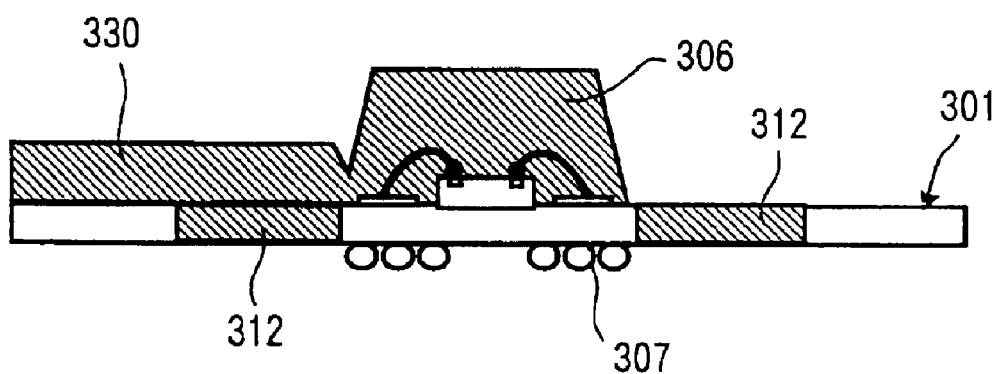
Figure 17C:
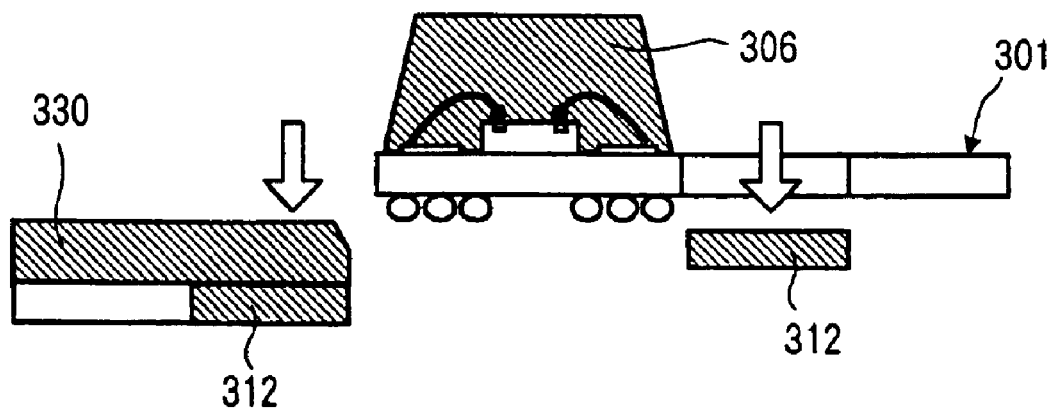

FIGS. 17A to 17C are cross-sectional views taken on line B—B in FIG. 8, showing the fabrication steps of a semiconductor apparatus using the board frame according to the fourth preferred embodiment of the present invention. As shown in FIG. 8, the board frame 301 includes a support region which is not arranged at an area corresponding to a gate of a die set. In other words, the area corresponding to the gate is pushed back.

FIG. 17A shows the board frame 301 in which push-back regions 312 have been pushed-back already, and a mold package 306 is formed over a semiconductor device in accordance with a transfer molding technique. After the transfer molding process, solder balls 307 are provided on the bottom surface of the board frame 301, as shown in FIG. 17B. Next, the push-back regions 312 are removed from the board frame 301, as shown in FIG. 17C. Then, the support regions (non pushed-back regions) 313c and 313d are removed together with an unnecessary resin 330 from the board frame 301.

Either of the push-back regions 312 or the support regions 313c and 313d can be removed first, or both can be removed at the same time. The push-back regions 312 and the support region 313c and 313d may be removed mechanically using punches.

Figure 18:
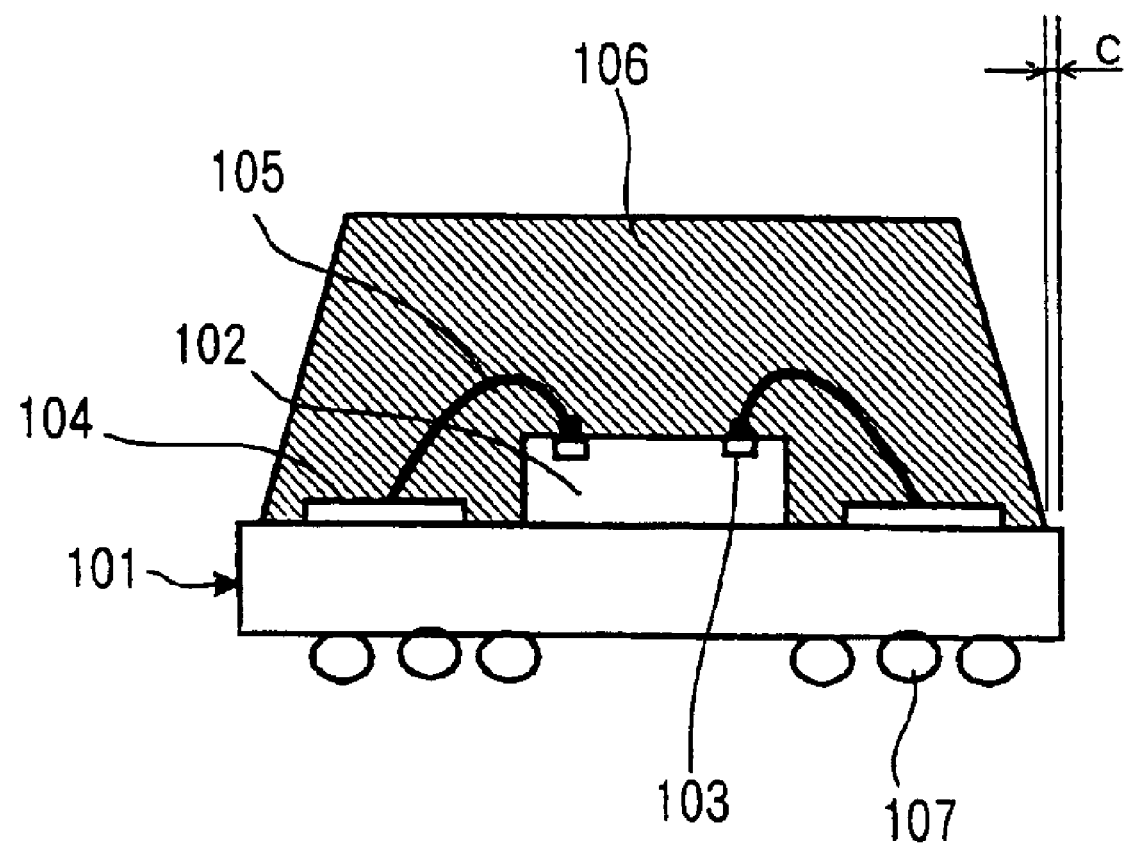
FIG. 18 is a cross-sectional view illustrating a semiconductor apparatus fabricated using the board frame according to one of the first to eighth preferred embodiments of the present invention.

FIG. 18 is a cross-sectional view illustrating a semiconductor apparatus fabricated using the board frame according to one of the first to eighth preferred embodiments of the present invention. For easy understanding, the board frame 101 shown in FIG. 5 is picked up as an example. According to the present invention, a distance "C" between the outer edge of the board frame 101 and the mold package 106 can be controlled to be small, or zero. Preferably, the distance "C" is less than 0.20 mm.

The present invention can be applied not only to a BGA (Ball Grid Array) type but also an LGA (Land Grid Array) type of semiconductor apparatus. An electric signal generated in the semiconductor device 102 is supplied from the electrodes 103 through the bonding wires 105 to the inner leads 104. The signal is supplied through a wiring circuit in the board frame 101 to the outer terminals 107.

In the present invention, the number of wiring board regions is not limited by three but can be two or more than three.

What is claimed is:

1. A method for fabricating a semiconductor apparatus using a board frame, comprising the steps of:
   providing on the board frame a wiring board region, which comprises an island on which a semiconductor device is to be mounted;
   defining a marginal region which surrounds the wiring board region, and a frame region that is located around the marginal region; a support region which extends between the wiring board region and the frame region so that the wiring board region and the frame region are connected to each other through the support region;
   removing the marginal region from the board frame and putting it back to its original position, while maintaining the wiring board region being connected to the frame region through the support region;
   mounting the semiconductor device onto the island in the wiring board region;
   transfer-molding the semiconductor device using a die set, which comprises a gate through which a thermosetting resin is guided in to a cavity thereof; and
   completely removing the marginal region from the board frame.

2. A method according to claim 1, wherein
   the support region is arranged at an area corresponding to the gate of the die set used.

3. A method according to claim 2, wherein the wiring board region and marginal region are shaped to be square, and the support region is arranged at a corner of the marginal region.

4. A method according to claim 2, wherein the support region is shaped to have a width which is getting wider from the wiring board region toward the frame region.

5. A method according to claim 1, wherein the support region comprises plural regions.

6. A method according to claim 5, wherein
the wiring board region and marginal region are shaped to be square; and
two of the support regions are arranged at the radial corners of the marginal region.

7. A method according to claim 5, wherein each of the support regions is shaped to have a width that is getting wider from the wiring board region toward the frame region.

8. A method according to claim 5, wherein one of the support regions is arranged at an area corresponding to the gate of the die set.

9. A method according to claim 5, wherein none of the support regions is arranged at an area corresponding to the gate of the die set.

10. A method according to claim 1, further comprising the step of:
removing the support region from the wiring board region after removing the marginal region completely from the board frame.

11. A method according to claim 1, wherein the transfer molding process is carried out to form a mold package having a bottom edge that is less than 0.2 mm apart from the edge of the wiring board region of the board frame.

12. A method for fabricating a semiconductor apparatus using a electrically non-conductive board frame, comprising the steps of:
a. providing the board frame with a wiring board region, the wiring board region including an island;
b. defining a marginal region of the board frame in an original position surrounding the wiring board region, a frame region of the board frame around the marginal region, and a support region of the board frame extending between the wiring board region and the frame region so that the wiring board region and the frame region are connected to each other through the support region;
c. removing the marginal region from the board frame so as to disconnected therefrom;
d. after said step c, replacing the marginal region back in the original position, while maintaining the wiring board region connected to the frame region through the support region;
e. mounting a semiconductor device onto the island, out of contact with and spaced from the replaced marginal region, after said step d;
f. transfer-molding the semiconductor device on the island using a die set, the die set including a gate through which a thermosetting resin is guided into a cavity thereof; and
g. after said step f, completely removing the marginal region from the board frame.

13. A method according to claim 12, wherein the support region is arranged at an area corresponding to the gate of the die set.

14. A method according to claim 13, wherein the wiring board region and marginal region are square-shaped, and the support region is arranged at a corner of the marginal region.

15. A method according to claim 12, wherein the support region includes plural support regions.

16. A method according to claim 15, wherein one of the plural support regions is arranged at an area corresponding to the gate of the die set.

17. A method according to claim 15, wherein none of the plural support regions is arranged at an area corresponding to the gate of the die set.

* * * * *